(12) United States Patent
Wyland et al.

(10) Patent No.: US 8,848,372 B2
(45) Date of Patent: Sep. 30, 2014

(54) NANOTUBE-BASED FLUID INTERFACE MATERIAL AND APPROACH

(75) Inventors: Chris Wyland, Livermore, CA (US); Hendrikus Johannes Jacobus Thoonen, Nijmegen (NL)

(73) Assignee: NXP B.V., Eindhoven (NL)

( * ) Notice: Subject to any disclaimer, the term of this patent is extended or adjusted under 35 U.S.C. 154(b) by 2180 days.

(21) Appl. No.: 11/718,714

(22) PCT Filed: Nov. 4, 2005

(86) PCT No.: PCT/IB2005/053627
§ 371 (c)(1),
(2), (4) Date: Mar. 28, 2008

(87) PCT Pub. No.: WO2006/048848
PCT Pub. Date: May 11, 2006

(65) Prior Publication Data
US 2009/0009973 A1    Jan. 8, 2009

Related U.S. Application Data

(60) Provisional application No. 60/625,449, filed on Nov. 4, 2004.

(51) Int. Cl.
*H05K 7/20* (2006.01)
*F28F 7/00* (2006.01)
*H01L 23/34* (2006.01)
*H01L 23/373* (2006.01)
*C09K 5/10* (2006.01)
*B82Y 10/00* (2011.01)

(52) U.S. Cl.
CPC ............... *B82Y 10/00* (2013.01); *H01L 23/373* (2013.01); *C09K 5/10* (2013.01)

USPC ........... 361/704; 361/702; 361/709; 361/705; 361/679.54; 165/80.2; 165/80.3; 257/713

(58) Field of Classification Search
USPC .................... 361/705, 702, 704, 709, 679.54; 257/713; 165/80.2–80.3
See application file for complete search history.

(56) References Cited

U.S. PATENT DOCUMENTS

| | | | | |
|---|---|---|---|---|
| 5,198,189 A | * | 3/1993 | Booth et al. | 420/555 |
| 5,459,352 A | * | 10/1995 | Layton et al. | 257/724 |
| 5,802,707 A | | 9/1998 | Brownell et al. | |
| 6,261,404 B1 | * | 7/2001 | Baska et al. | 156/310 |
| 6,407,922 B1 | | 6/2002 | Eckblad et al. | |
| 6,473,351 B2 | * | 10/2002 | Tomanek et al. | 365/215 |
| 6,542,371 B1 | | 4/2003 | Webb | |
| 6,774,482 B2 | * | 8/2004 | Colgan et al. | 257/712 |
| 6,856,016 B2 | * | 2/2005 | Searls et al. | 257/720 |

(Continued)

FOREIGN PATENT DOCUMENTS

| | | |
|---|---|---|
| EP | 1186689 A | 3/2002 |
| EP | 1199328 A | 4/2002 |

(Continued)

*Primary Examiner* — Bradley Thomas

(57) ABSTRACT

A thermal interface material facilitates heat transfer between an integrated circuit device and a thermally conductive device. According to an example embodiment, a thermal interface material includes carbon nanotube material that enhances the thermal conductivity thereof. The interface material flows between an integrated circuit device and a thermally conductive device. The carbon nanotube material conducts heat from the integrated circuit device to the thermally conductive device.

20 Claims, 4 Drawing Sheets

(56) References Cited

U.S. PATENT DOCUMENTS

| | | | |
|---|---|---|---|
| 6,891,724 B2 * | 5/2005 | De Lorenzo et al. | 361/704 |
| 6,924,335 B2 * | 8/2005 | Fan et al. | 524/495 |
| 6,965,513 B2 * | 11/2005 | Montgomery et al. | 361/679.46 |
| 6,994,584 B1 * | 2/2006 | Santana et al. | 439/485 |
| 7,086,451 B2 * | 8/2006 | Leu et al. | 165/80.3 |
| 7,272,010 B1 * | 9/2007 | Santana et al. | 361/720 |
| 7,535,715 B2 * | 5/2009 | Chung | 361/707 |
| 8,268,282 B2 * | 9/2012 | Hougham et al. | 423/448 |
| 2002/0163079 A1 * | 11/2002 | Awano | 257/750 |
| 2003/0096104 A1 * | 5/2003 | Tobita et al. | 428/332 |
| 2003/0111333 A1 * | 6/2003 | Montgomery et al. | 204/164 |
| 2003/0117770 A1 * | 6/2003 | Montgomery et al. | 361/687 |
| 2003/0143382 A1 * | 7/2003 | Xu | 428/209 |
| 2004/0005736 A1 * | 1/2004 | Searls et al. | 438/122 |
| 2004/0017656 A1 * | 1/2004 | Lee et al. | 361/687 |
| 2004/0053053 A1 * | 3/2004 | Jiang et al. | 428/408 |
| 2004/0097635 A1 * | 5/2004 | Fan et al. | 524/496 |
| 2004/0108589 A1 | 6/2004 | Heilbronner | |
| 2004/0124526 A1 * | 7/2004 | Matayabas et al. | 257/712 |
| 2004/0125565 A1 * | 7/2004 | Chen et al. | 361/704 |
| 2004/0150100 A1 * | 8/2004 | Dubin et al. | 257/720 |
| 2004/0261987 A1 * | 12/2004 | Zhang et al. | 165/183 |
| 2004/0265489 A1 * | 12/2004 | Dubin | 427/212 |
| 2004/0266063 A1 * | 12/2004 | Montgomery et al. | 438/119 |
| 2004/0266065 A1 * | 12/2004 | Zhang et al. | 438/122 |
| 2005/0006754 A1 * | 1/2005 | Arik et al. | 257/712 |
| 2005/0061496 A1 * | 3/2005 | Matabayas, Jr. | 165/185 |
| 2005/0092464 A1 * | 5/2005 | Leu et al. | 165/80.3 |
| 2005/0116336 A1 * | 6/2005 | Chopra et al. | 257/720 |
| 2005/0126766 A1 * | 6/2005 | Lee et al. | 165/133 |
| 2005/0136248 A1 * | 6/2005 | Leu et al. | 428/332 |
| 2005/0139642 A1 * | 6/2005 | Koning et al. | 228/245 |
| 2005/0139991 A1 * | 6/2005 | White et al. | 257/706 |
| 2005/0167647 A1 * | 8/2005 | Huang et al. | 257/14 |
| 2005/0215049 A1 * | 9/2005 | Horibe et al. | 438/622 |
| 2005/0248924 A1 * | 11/2005 | Farrow et al. | 361/704 |
| 2005/0254208 A1 * | 11/2005 | Belady et al. | 361/690 |
| 2005/0255304 A1 * | 11/2005 | Brink | 428/209 |
| 2005/0260412 A1 * | 11/2005 | Gardner | 428/408 |
| 2005/0269726 A1 * | 12/2005 | Matabayas, Jr. | 264/104 |
| 2005/0270744 A1 * | 12/2005 | Farrow et al. | 361/704 |
| 2006/0090885 A1 * | 5/2006 | Montgomery et al. | 165/104.33 |
| 2006/0226551 A1 * | 10/2006 | Awano | 257/773 |
| 2006/0246276 A1 * | 11/2006 | Chung | 428/323 |
| 2006/0270116 A1 * | 11/2006 | Dangelo | 438/122 |
| 2007/0057415 A1 * | 3/2007 | Katagiri et al. | 264/614 |
| 2007/0102809 A1 * | 5/2007 | Dubin | 257/713 |
| 2007/0114657 A1 * | 5/2007 | Dangelo et al. | 257/720 |
| 2007/0114658 A1 * | 5/2007 | Dangelo et al. | 257/720 |
| 2007/0126116 A1 * | 6/2007 | Dangelo et al. | 257/720 |
| 2008/0144287 A1 * | 6/2008 | Shigaki et al. | 361/704 |

FOREIGN PATENT DOCUMENTS

| | | |
|---|---|---|
| JP | 2007160470 A * | 6/2007 |
| WO | 01/92381 A | 12/2001 |
| WO | 2004/114404 A | 12/2004 |
| WO | 2005/031864 A | 4/2005 |

* cited by examiner

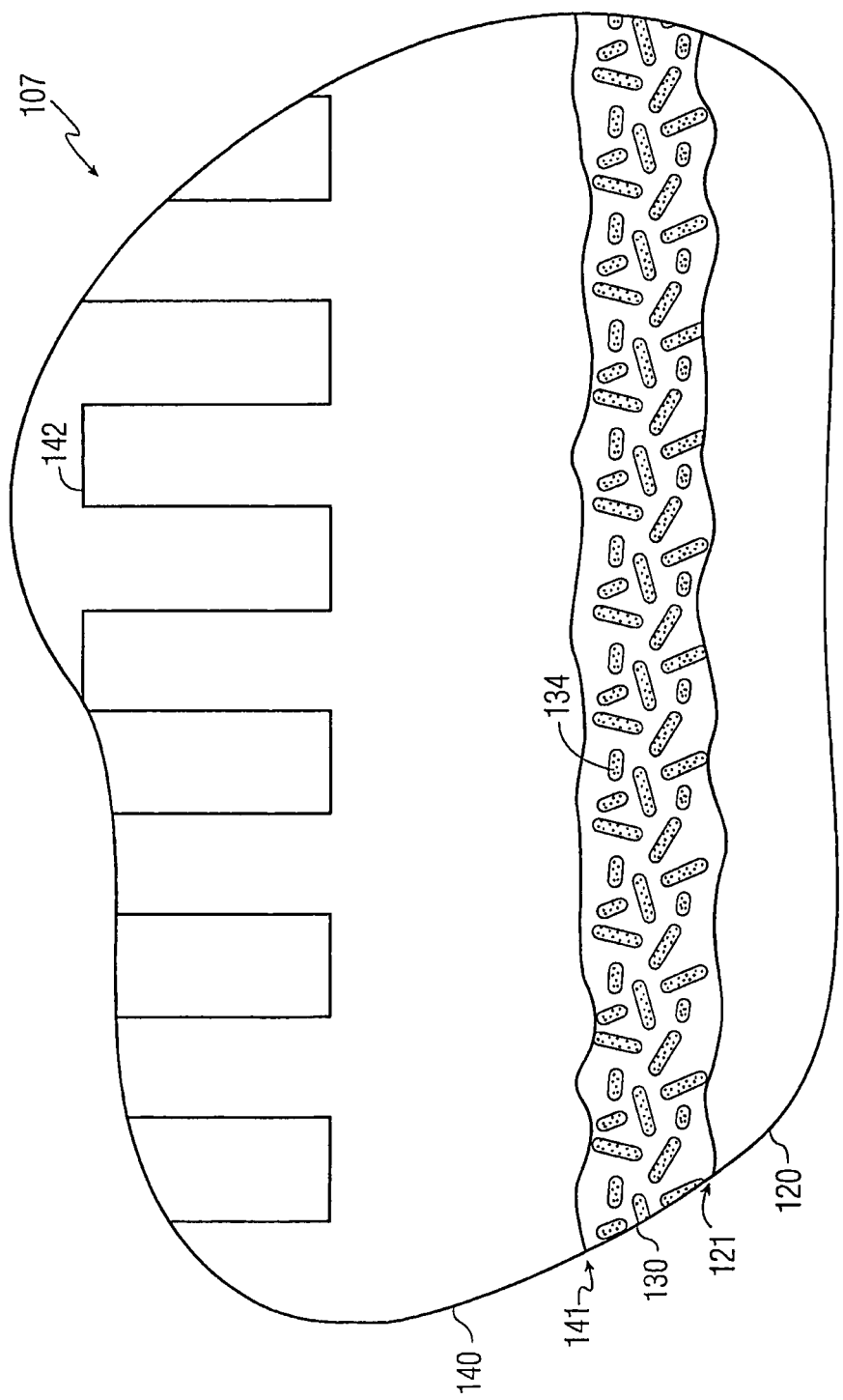

NANOTUBE-BASED FLUID INTERFACE MATERIAL AND APPROACH

The present invention is directed to integrated circuit devices and approaches and, more particularly, to integrated circuit applications involving fluid interface material.

The integrated circuit industry has experienced technological advances that have permitted dramatic increases in circuit density and complexity, and equally dramatic decreases in the size of circuit components and circuit arrangements. These technology advances have promulgated equally dramatic growth in the industry and corresponding demand for products employing high-density, complex and compact integrated circuit devices.

With increased circuit density and functionality characterizing circuit designs, there is often a need for many interconnects (and many interconnects and vias) in a small area. In addition, there is often a need for greater power consumption to power the circuits. Increased density and/or power consumption generally leads to increased heat generation, which can pose potential problems for circuit components. In addition, as the size of circuit arrangements (and, correspondingly, components associated with circuit arrangements) is reduced, these circuit arrangements are often placed under increased heat-related stress.

In some instances, the inadequate removal of heat can lead to longevity and performance issues. As integrated circuit devices are manufactured with higher density, this problem is exacerbated. Further, as higher performance from integrated circuits is required, performance fluctuations relating to thermal issues can lead to performance issues.

One approach to addressing heat-related issues in integrated circuits has involved the use of heat sinks or other components that conduct heat. Thermally conductive materials are often arranged with integrated circuits to facilitate heat transfer from the circuits and, ultimately, away from the thermally conductive materials. Many applications involve the use of air-cooled materials, such as a metal heat sink with fin arrangements that provide desirable surface area for heat exchange. Heat from the integrated circuit is transferred to the heat sink and, accordingly, to surrounding air.

While heat sinks and other thermally conductive components have been used with relative success, challenges to these and other related applications continue to exist and have become more prevalent as heat generation continues to remain an issue. The ability to conduct heat away from integrated circuit devices has been inhibited by interface characteristics between devices and thermally conductive components intended for removing heat from the devices. Where surfaces are not in contact, heat transfer is generally inhibited. Surface characteristics such as roughness tend to make direct contact between components challenging, which can often result in gaps or voids between surfaces. These gaps or voids have a thermally insulative effect.

These and other difficulties present challenges to the implementation of circuit substrates for a variety of applications.

Various aspects of the present invention involve interface approaches implemented with integrated circuits and other devices. The present invention is exemplified in a number of implementations and applications, some of which are summarized below.

According to an example embodiment of the present invention, a nanotube-based conductive material facilitates conductivity (e.g., thermal and/or electric) between an integrated circuit device and another component such as a substrate.

In another example embodiment of the present invention an integrated circuit chip arrangement employs a carbon nanotube-based fluid interface material to facilitate thermal and/or electrical conductivity. The integrated circuit chip arrangement includes an integrated circuit chip and a conductive (i.e., thermally and/or electrically) device adjacent the integrated circuit chip. An interface region is immediately adjacent the integrated circuit chip and the thermally conductive device and includes carbon nanotube material in a fluid mixture. The carbon nanotube material is arranged with the fluid mixture to thermally couple heat between the integrated circuit chip and the thermally conductive device.

According to another example embodiment of the present invention, an integrated circuit chip arrangement interfaces with a thermally conductive material. An integrated circuit chip having a relatively rough upper surface (e.g., with peaks and wells at a microscopic level) is arranged with an interface material that fills in roughness characteristics, facilitating direct thermal and/or electrical coupling with recessed and other rough regions of the upper surface. The material includes a fluid base and carbon nanotube material mixed therein. The carbon nanotube material mixture is adapted for flowing into the wells. In one implementation, the interface material further has a top surface over the integrated circuit's rough upper surface, the top surface being smooth, relative to the rough upper surface, and adapted for interfacing with thermally-conductive devices such as heat sinks.

The above summary of the present invention is not intended to describe each illustrated embodiment or every implementation of the present invention. The figures and detailed description that follow more particularly exemplify these embodiments.

The invention may be more completely understood in consideration of the following detailed description of various embodiments of the invention in connection with the accompanying drawings, in which:

FIG. 1C shows a close-up representation of a cut-away view of an integrated circuit package arrangement of FIG. 1A, according to another example embodiment of the present invention.

Figure 1A:
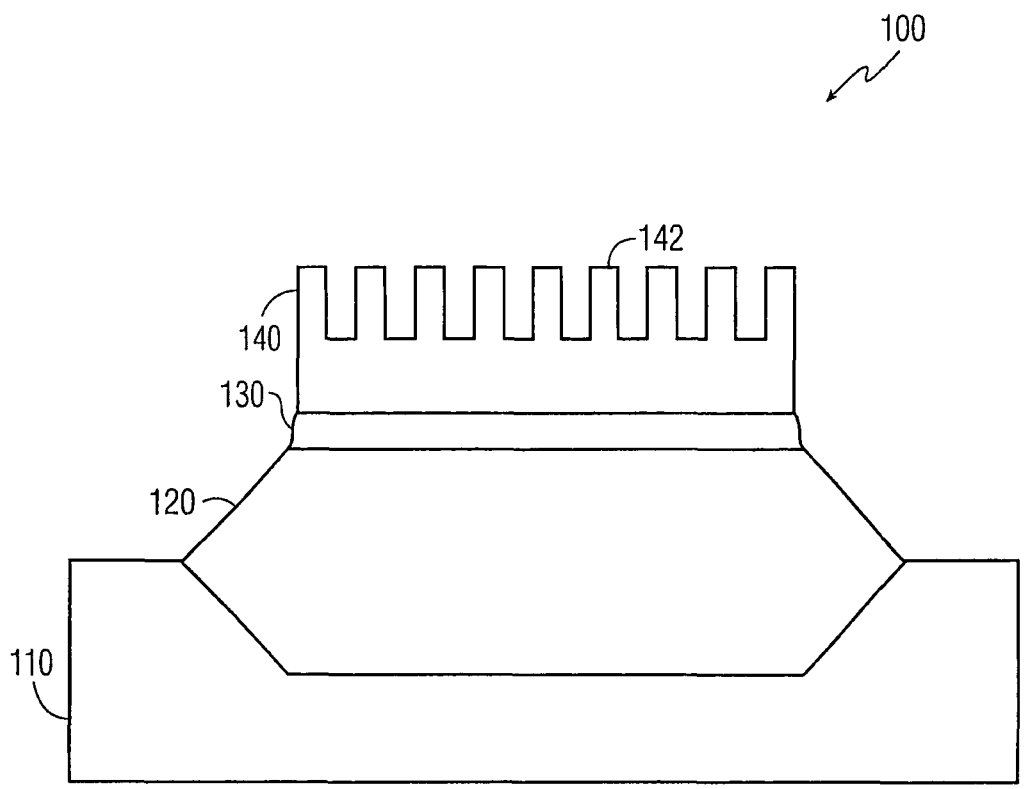
FIG. 1A shows a cut-away view of an integrated circuit package arrangement with a fluid interface material, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

The present invention is believed to be applicable to a variety of circuits and approaches involving and/or benefiting from interface materials, and in particular, from fluid interface materials such as thermal grease. While the present invention is not necessarily limited to such applications, an appreciation of various aspects of the invention is best gained through a discussion of examples in such an environment.

According to an example embodiment of the present invention, a nanotube-enhanced fluid interface-type material facilitates heat transfer from circuit components. The interface-type material is configured for flowing between surfaces of a circuit device and a thermally-conductive component such as a heat sink. Nanotube material in the interface-type material facilitates thermal conductivity of the interface-type material and, correspondingly, thermal coupling between the circuit and the thermally-conductive component.

In another example embodiment of the present invention, a carbon-nanotube enhanced thermal interface material has viscous characteristics that facilitate flow into voids, or openings, between surfaces of an integrated circuit chip and a heat sink arranged against the ship. The thermal interface material has a base component and carbon nanotube material, such as nanotubes and/or nanotube dust, the base component providing a medium in which to mix the carbon nanotube material. When implemented in contact with both the integrated circuit chip and the heat sink, the thermal interface material thermally couples (i.e., provides a thermally-conductive medium between) the integrated circuit chip and heat sink. This thermal coupling generally enhances the rate of heat transfer between the integrated circuit chip and the heat sink relative, e.g., to heat transfer rates across material in voids such as air, or to conventional materials.

A variety of different base components are implemented with the carbon nanotube material, depending upon the application and available material. For instance, carbon nanotube material mixed into an epoxy with appropriate viscosity characteristics can be flowed between an integrated circuit chip and a heat sink. Similarly, a low-viscosity binder material can be used to hold a carbon nanotube material mix for such applications. Other materials such as grease, oil, alcohol and more are used as base components with carbon nanotube material in accordance with certain embodiments. Further, mixtures of these or other materials can further be used in these and other applications.

A variety of types of carbon nanotube material can be used in the various applications discussed herein, and is mixed with other materials in particular applications to suit selected needs. For example, carbon nanotube dust, multi-walled and single-walled carbon nanotubes, and other carbon-nanotube based materials are used for different applications. These carbon nanotube materials are generally small; i.e., smaller than silica or other filler material.

In some implementations, the carbon nanotube material is tailored in size and arrangement to achieve desirable flow characteristics. For example, in applications involving very small areas in which the interface material is to be flowed, relatively small sized carbon nanotube material is used, such as carbon nanotube dust or single-walled carbon nanotubes. In applications where high flow characteristics are not necessarily desirable, relatively larger sized carbon nanotube material is used, such as carbon nanotube chains or matrices. Further, some applications involve the use of a combination of different sizes of carbon nanotube material.

In one implementation, carbon nanotube material implemented with a base material are arranged with a surface of an integrated circuit device in such a manner that the carbon nanotube material contacts the surface. Thermal resistance between the surface and the interface (base) material is substantially reduced via the thermal connection made as a result of the carbon nanotube material directly contacting the surface.

The carbon nanotube material is arranged to contact the surface of the integrated circuit device using one or more of a variety of approaches. In one implementation, the base material is loaded with a sufficient amount of carbon nanotube filler to facilitate direct contact between the filler and a surface or surfaces of the integrated circuit device. When carbon nanotube dust (e.g., powder) is used, a sufficient loading of the base material with the dust brings a multitude of carbon nanotube particles into contact with the surface.

In another implementation, the concentration of carbon nanotube filler material such as dust is selected, relative to the base material, to achieve desirable flow characteristics while maximizing the concentration of filler material. This maximization facilitates heat transfer while achieving flow characteristics that make possible the thermal interaction between the filler material and the surface. One such implementation involves the mixture of oil with carbon nanotube powder. Another such implementation involves the mixture of alcohol with carbon nanotube powder.

In other implementations, the concentration of carbon nanotube filler material is selected to achieve desirable electrical conductivity characteristics. For instance, where electrical conductivity between an integrated circuit chip and a thermally conductive device such as a heat sink is desirable (or, e.g., not undesirable), the concentration of carbon nanotube filler material in the base material is high. Where electrical conductivity between the integrated circuit chip and other components (including a thermally conductive device) is undesirable, the concentration of carbon nanotube material in the base material is relatively low. In these instances, the characteristics of the base material are taken into consideration when selecting a concentration of carbon nanotube material to use. Where the base material is insulative, electrical conductivity relating to the carbon nanotube material is generally inhibited by the insulative nature of the base material and, correspondingly, the concentration of carbon nanotube material is selected relative to these insulative characteristics.

Turning now to the figures, FIG. 1 shows a semiconductor arrangement 100 employing carbon nanotube material to facilitate heat transfer with a thermal dissipation device, according to another example embodiment of the present invention. The arrangement 100 includes an integrated circuit chip 120 arranged on and coupled to a supporting substrate 110 using, e.g., an adhesive material contacting facing surfaces thereof. Further packaging components (e.g., electrical connections, mold compounds) can be implemented with the integrated circuit chip 120 and substrate 110 package, depending upon the application, and are omitted here for brevity.

A heat sink 140 is arranged over the integrated circuit chip 120, with a thermal interface material 130 separating the heat sink and the chip. The heat sink 140 is shown in an arrangement by way of example, with a multitude of types heat sinks (or other thermally conductive materials) applicable for use in connection with this and other example embodiments. In FIG. 1A, the heat sink 140 is shown with a plurality of heat fins, with a representative heat fin labeled 142, extending generally upward from the integrated circuit chip 120 and arranged to facilitate cooling.

The thermal interface material 130 includes a base material with carbon nanotube filler contributing to the thermal conductivity of the thermal interface material. The carbon nanotube filler conducts heat generated in the integrated circuit chip 120 (or passed from the substrate 110) away from the integrated circuit chip and to the heat sink 140. Thermal gradients across the arrangement 100 facilitate the heat transfer, with heat in the integrated circuit passing to the relatively cooler heat sink (cooled, e.g., by a surrounding medium such as air or liquid). In general, the presence of the carbon nanotube filler in the thermal interface material 130 increases the overall thermal conductivity of the interface material and, accordingly, facilitates a generally rapid transfer of heat across the interface between the integrated circuit chip 120 and the heat sink 140.

Various portions of the arrangements shown FIG. 1B and FIG. 1C (discussed below) that are similar to those in FIG. 1A (and with each other) are labeled with common reference numerals. Certain discussion of these elements, where previously discussed, is omitted for brevity.

Figure 1B:
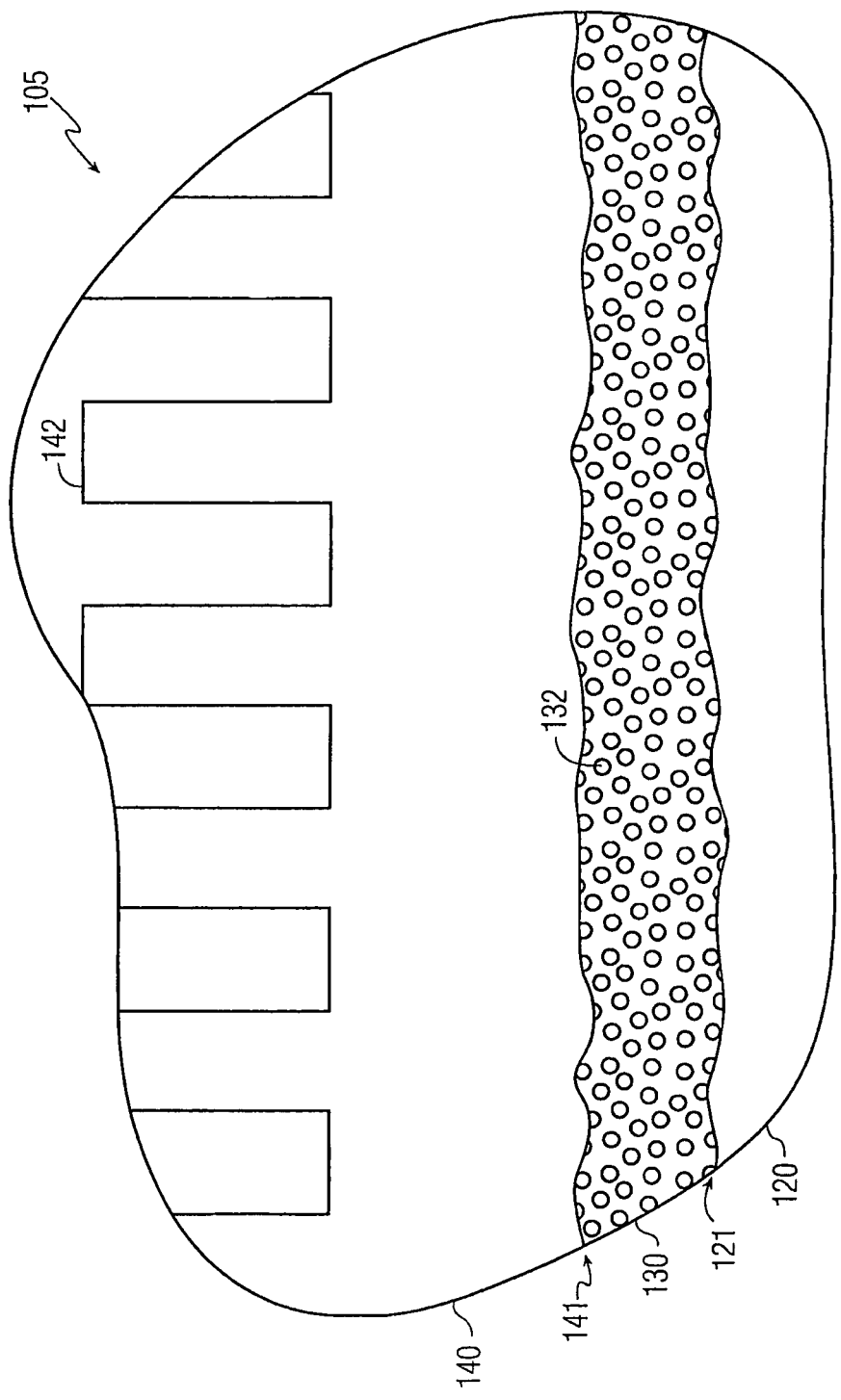
FIG. 1B shows a close-up representation of a cut-away view of the integrated circuit package arrangement of FIG. 1A, according to another example embodiment of the present invention.

FIG. 1B shows a close-up view 105 of the interface between the integrated circuit chip 120 and the heat sink 140 as shown in FIG. 1A, with carbon nanotube material arranged in accordance with another example embodiment of the invention. Surfaces 121 and 141 of the integrated circuit device 120 and the heat sink 140, respectively, exhibit surface roughness as shown, with thermal interface material 130 contacting each respective surface. Carbon nanotube particles in the thermal interface material 130, show with representative particle 132, facilitate heat transfer across the interface between the surfaces 121 and 141.

The carbon nanotube particles such as particle 132 include one or more of a variety of types of carbon nanotube material, such as parts of single-walled and/or multi-walled carbon nanotubes, carbon nanotube dust (e.g., ground carbon nanotubes) or arrangements of carbon nanotubes. The nature of the shape of the carbon nanotube particles facilitates the filling of rough areas at each surface 121 and 141, with carbon nanotube material close to (or touching) each surface for heat transfer.

FIG. 1C shows another close-up view 107 of the interface between the integrated circuit chip 120 and the heat sink 140 as shown in FIG. 1A, with carbon nanotube material arranged in accordance with another example embodiment of the invention. Surfaces 121 and 141 exhibit surface roughness as discussed above with FIG. 1B, with thermal interface material 130 again contacting each respective surface. In FIG. 1C, carbon nanotubes are mixed in a base to make up the thermal interface material 130, with a representative carbon nanotube labeled 134. These carbon nanotubes facilitate heat transfer between the surfaces 121 and 141.

The carbon nanotubes in the thermal interface material 130 (such as carbon nanotube 134) include single-walled and/or multi-walled carbon nanotubes, depending upon the implementation. Further, the orientation of the carbon nanotubes is selected to fit particular applications. The orientation shown in FIG. 1C is generally in multiple directions and/or random; however, certain implementations involve the ordered arrangement of the carbon nanotubes to facilitate heat transfer and/or other desirable characteristics. For instance, some implementations involve the arrangement of the carbon nanotubes in a generally perpendicular orientation, relative to the surfaces 121 and 141. Such a generally perpendicular orientation facilitates heat transfer along the carbon nanotubes, in a direction between the surfaces.

The orientation of the carbon nanotubes in the thermal interface material 130 can be achieved in a variety of manners. For instance, when magnetized, the carbon nanotubes can be aligned using a magnetic field. Once aligned, the base material in which the carbon nanotubes are mixed tends to maintain the position of the carbon nanotubes after the magnetic field is removed. Other approaches to orientation include using approaches to flowing the interface material 130 that produces a desirable orientation (e.g., where the carbon nanotubes tend to align themselves with flow patterns).

Figure 2:
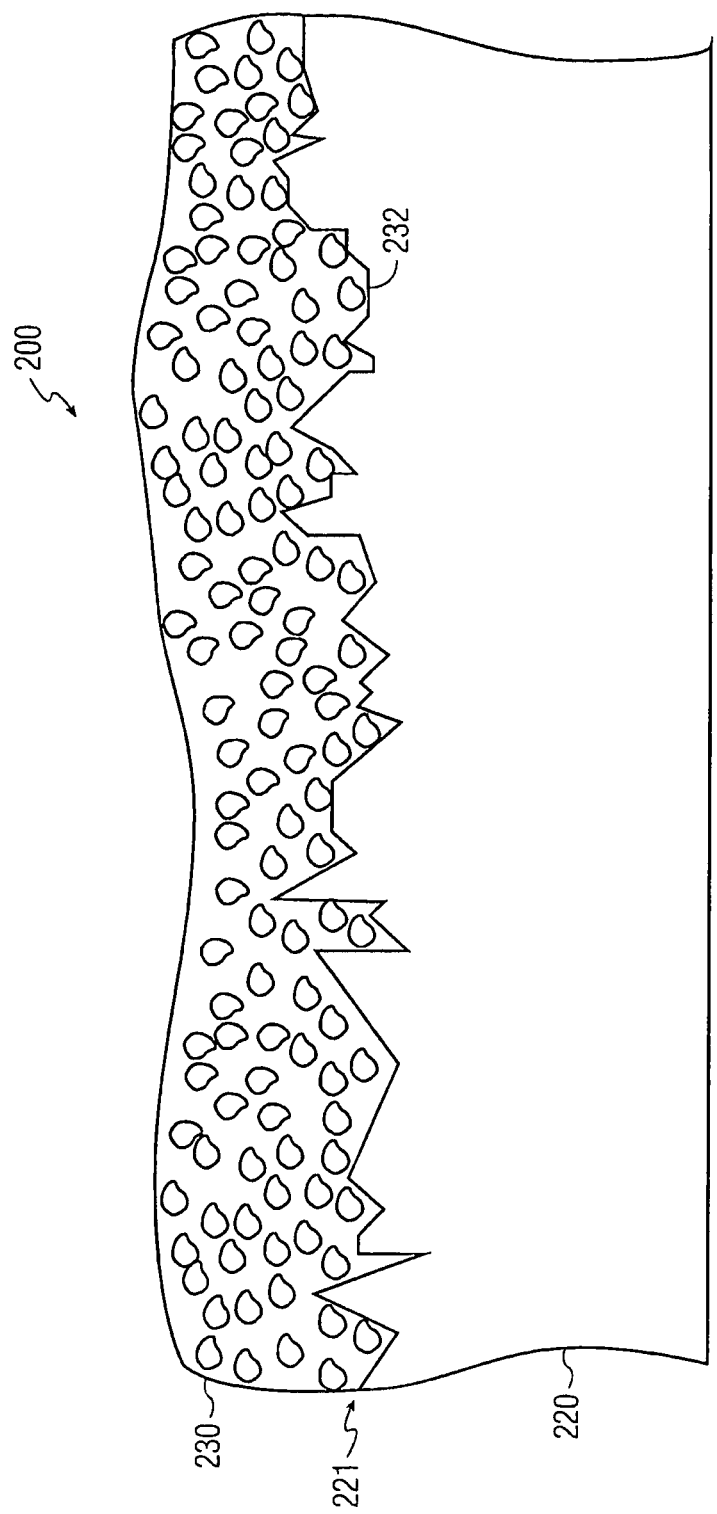
FIG. 2 shows a cut-away view of an integrated circuit package arrangement adjacent to a fluid interface material and showing surface roughness, according to another example embodiment of the present invention.

FIG. 2 shows a cross-sectional view of an integrated circuit arrangement 200 at a microscopic level with a carbon nanotube-enhanced interface material, according to another example embodiment of the present invention. An integrated circuit chip 220 has a surface 221 that exhibits roughness, with various high and low areas (e.g., peaks and wells) as well as a variety of geometrical arrangements. Such roughness, as typically associated with a variety of different types of integrated circuit devices, tends to make interfacing thermally-conductive devices with the integrated circuit chip 220 challenging. That is, where the surface 221 has high and low points there tends to be voids where interfacing devices do not contact the surface.

A fluid thermal interface material 230 is arranged on the surface 221 for transferring heat therefrom. The fluid thermal interface material 230 includes a carbon nanotube material (e.g., particles, dust and/or nanotubes) in a base material, such as a grease. The carbon nanotube material, with a representative particle labeled 232, conducts heat and correspondingly facilitates a favorable thermal conductivity characteristic of the fluid interface material 230. Certain carbon nanotube material in contact with the surface 221 facilitates direct thermal contact with the integrated circuit 220. Further, the fluid nature of the fluid interface material 230, coupled with the relatively small sized of the carbon nanotube material (e.g., dust) results in thermally conductive material filling into low regions at the surface 221. For instance, the low region near representative particle 232 is filled and thus thermal conductivity from the surface 221 nearby is facilitated by the relative proximity of the carbon nanotube material. In this regard, heat generated in circuitry in the integrated circuit chip 220 is transferred away from the chip by the fluid thermal interface material 230.

The arrangement 200 is adapted for interfacing with a thermally-conductive arrangement at an upper region of the fluid interface material 230 that is generally receptive to conforming to many different shapes. In this regard, the fluid interface material 230 permits the use of a variety of thermally-conductive devices in many arrangements, with the fluid interface material providing a thermally conductive path with the integrated circuit chip 220. For example, heat sinks such as those shown in FIGS. 1A-1C are implemented with the approach shown in FIG. 2 for a variety of applications.

The various embodiments described above and shown in the figures are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For example, the carbon nanotubes may be implemented with material different from, or in addition to, carbon, such as Boron. In addition, the interface-type materials discussed by way of example may be implemented with a multitude of different types of materials, used alone and/or in conjunction with one another or with the above-described materials. Such modifications and changes do not depart from the true spirit and scope of the present invention.

What is claimed is:

1. An integrated circuit chip arrangement comprising:
   an integrated circuit chip;
   a thermally conductive device adjacent the integrated circuit chip; and
   an interface region immediately adjacent the integrated circuit chip, the interface region including carbon nanotube material in a fluid mixture, the carbon nanotube material configured and arranged with the fluid mixture to thermally couple heat between the integrated circuit chip and the thermally conductive device.

2. The arrangement of claim 1, wherein the carbon nanotube material includes at least one of: carbon nanotube dust, single-walled carbon nanotubes and multi-walled carbon nanotubes.

3. The arrangement of claim 1, wherein the fluid mixture includes at least one of: epoxy, low-viscosity binder having a viscosity that permits the mixture to flow, grease, alcohol and oil.

4. The arrangement of claim 3, wherein the fluid mixture is the carbon nanotube material mixed with fluid to facilitate flow of the carbon nanotube material.

5. The arrangement of claim 1, wherein the integrated circuit ship has an upper surface exhibiting surface roughness and wherein the carbon nanotube material is sufficiently small to flow into recessed areas of the upper surface.

6. The arrangement of claim 1, wherein the carbon nanotube material includes carbon nanotubes oriented in a direction generally parallel to a desired heat transfer path between the integrated circuit chip and the thermally conductive device.

7. The arrangement of claim 6, wherein the carbon nanotubes are oriented in a direction of flow of the fluid mixture between the integrated circuit chip and the thermally conductive device.

8. The arrangement of claim 6, wherein the carbon nanotubes are magnetized.

9. The arrangement of claim 8, wherein the carbon nanotubes are oriented in the direction of a magnetic field.

10. The arrangement of claim 1, wherein the carbon nanotube material includes different sized carbon nanotube material.

11. The arrangement of claim 10, wherein the carbon nanotube material includes carbon nanotube dust sized to flow into surface voids and carbon nanotubes.

12. The arrangement of claim 11, wherein the carbon nanotube material includes carbon nanotube chains.

13. The arrangement of claim 1, wherein the concentration of carbon nanotube material in the fluid mixture is selected to achieve a desired thermal conductivity of the fluid mixture.

14. The arrangement of claim 1, wherein the fluid mixture has an electrical conductivity that is a function of the concentration of carbon nanotube material therein.

15. The arrangement of claim 14, wherein the fluid mixture has an electrical conductivity that is sufficiently high to conduct electricity between the integrated circuit chip and the thermally conductive device.

16. The arrangement of claim 14, wherein the fluid mixture has an electrical conductivity that is sufficiently low to inhibit electrical conductivity between the integrated circuit chip and the thermally conductive device.

17. An integrated circuit chip arrangement for interfacing with a thermally conductive material, the arrangement comprising:
an integrated circuit chip having a rough upper surface; and
an interface material on the upper surface, the interface material comprising:
a fluid base; and
carbon nanotube material mixed in the fluid base and adapted for flowing into regions of the rough upper surface that are recessed, relative to other portions of the rough upper surface.

18. The integrated circuit chip arrangement of claim 17, wherein the interface material is further adapted to flow into recessed regions of thermally-conductive devices placed on the interface material.

19. The integrated circuit chip arrangement of claim 17, wherein the interface material has a thermal conductivity characteristic that varies as a function of the amount of carbon nanotube material therein.

20. The integrated circuit chip arrangement of claim 17, wherein the interface material has a top surface over the rough upper surface, the top surface being smooth, relative to the rough upper surface, and adapted for interfacing with thermally-conductive devices.

* * * * *